United States Patent [19]

Swan et al.

[11] Patent Number: 4,806,852

[45] Date of Patent: Feb. 21, 1989

[54] AUTOMATIC TEST SYSTEM WITH ENHANCED PERFORMANCE OF TIMING GENERATORS

[75] Inventors: Richard Swan, San Jose; Mike Catalano, Tahoe City; Richard Feldman, Sunnyvale, all of Calif.

[73] Assignee: Megatest Corporation, San Jose, Calif.

[21] Appl. No.: 8,030

[22] Filed: Jan. 28, 1987

Related U.S. Application Data

[63] Continuation-in-part of Ser. No. 648,870, Sep. 7, 1984, abandoned.

[51] Int. Cl.$^4$ .................. G01R 19/00; G01R 19/25
[52] U.S. Cl. ...................... 324/73 R; 324/73 AT; 371/27; 371/62
[58] Field of Search .......... 324/73 R, 73 AT, 74; 371/15, 25, 27, 62

[56] References Cited

U.S. PATENT DOCUMENTS

| | | | |
|---|---|---|---|
| 3,718,910 | 2/1973 | Scray, Jr. et al. ............... | 324/73 R |
| 4,339,819 | 7/1982 | Jacobson ........................ | 324/73 R |
| 4,497,056 | 1/1985 | Sugamori ........................ | 324/73 R |
| 4,517,661 | 5/1985 | Graf et al. ..................... | 324/73 AT |
| 4,577,318 | 3/1986 | Whitacre et al. ................ | 324/73 R |
| 4,607,214 | 8/1986 | Welzhofer ...................... | 324/73 R |
| 4,656,632 | 4/1987 | Jackson ......................... | 324/73 AT |

FOREIGN PATENT DOCUMENTS

| | | | |
|---|---|---|---|
| 0070757 | 5/1980 | Japan ............................. | 324/73 R |
| 2108277 | 5/1983 | United Kingdom ............. | 324/73 R |

OTHER PUBLICATIONS

"Logic Checking Device", by Abrams, IBM Tech. Disc. Bull., vol. 2 #6, 4/60, p. 60, cl. 371-62.
"Why and How Users Use Microprocessors", by Scrupski, Electronics, 3/2/78, pp. 97-104.

Primary Examiner—Reinhard J. Eisenzopf
Assistant Examiner—W. Burns
Attorney, Agent, or Firm—Alan H. MacPherson; Brian D. Ogonowsky; Paul J. Winters

[57] ABSTRACT

A unique automatic test system (100) is provided in which timing signals are generated in a novel manner as compared with prior art test systems. All adjustments for propagation delays of timing signals are made in a digital fashion, by adjusting the digital information which defines when an analog timing signal is to be generated. Deskewing of propagation delays is performed automatically under computer control, rather than by requiring careful adjustment of hardware deskewing elements. By adjusting for propagation skews digitally, propagation skews dependent on data values (logical 0 and logical 1) can be made. Furthermore, timing signals are provided by three timing edges, rather than by a timing pulse, thereby allowing more accurate generation of timing signals. The use of a complex switching matrix is eliminated by providing at least one timing generator per pin of the device under test, thereby eliminating complex hardware, propagation errors related to switching matrices, and providing enhanced capabilities for the user while simultaneously simplifying the problems associated with creating software used to control the test system during testing a device under test.

13 Claims, 6 Drawing Sheets

SEQUENCE OF NON-RETURN WAVEFORMS

SEQUENCE OF RETURN-TO-ZERO WAVEFORMS

SEQUENCE OF RETURN-TO-ONE WAVEFORMS

AUTOMATIC TEST SYSTEM WITH ENHANCED PERFORMANCE OF TIMING GENERATORS

CROSS-REFERENCE TO RELATED APPLICATIONS

This is a continuation-in-part of the application Ser. No. 648,870, filed Sept. 7, 1984, now abandoned.

BACKGROUND OF THE INVENTION

This invention relates to automatic test systems, and more specifically to automatic test systems utilizing timing generators which provide timing signals to an electronic device or circuit being tested.

Automatic test systems are well known in the prior art. FIG. 1 shows a block diagram of a typical prior art automatic test system 10. Test system 10 includes master clock 11, vector sequencing logic 12, device under test (DUT) power supplies (13), parametric measuring unit (PMU) 14, central processing unit (CPU) 15, computer memory 16, local peripheral devices 17, communication interface 18, and user work stations 19. Master clock 11 is the master system clock and provides a master clock signal which is typically generated from a very stable element such as a quartz crystal. Vector sequencing logic 12 serves to sequentially access test vectors stored in vector memory 22 in order to test DUT 30. DUT power supplies 13 serve to, under CPU control, provide desired voltage and current levels to device under test (DUT) 30. PMU 14 serves to, under CPU control, measure selected electrical parameters of DUT 30. CPU 15 controls the overall operation of test system 10. Computer memory 16 serves as a means for storing data for use by CPU 15. Local peripherals 17 typically are peripherals such as line printers, video displays, and the like. Communication interface 18 may, if desired, be provided in order to allow test system 10 to communicate with other systems. User work stations 19 are provided in order to allow a user to control the operation of test system 10, such as in order to load specific test programs for testing desired devices, and for monitoring certain test results. Computer bus 20 serves to allow interconnection between CPU 15, computer memory 16, local peripheral 17, communication interface 18, user work stations 19, and additional computers or peripherals (not shown).

Test system 10 includes a limited number of timing generators 24 which each provide a single analog timing signal having its leading edge and trailing edge controlled by CPU 15 or associated hardware. In such prior art test systems, the number of timing generators was limited because timing generators are rather expensive, and in the early days of automatic test systems, the devices to be tested were relatively small and unsophisticated as compared with today's devices, and thus only a relatively few (i.e., approximately sixteen) timing generators were necessary in order to perform all the electrical testing of the device under test. In order to allow the timing signals provided by these limited number of timing generators to be used on any lead of the device under test, a rather complex switching matrix 25 is utilized in order to function essentially as a cross point switch to allow the signals from the limited number of timing generators to be applied to selected ones of wave formatters 26. This also allows a single timing signal to be applied to a plurality of leads of DUT 30 in a plurality of formats during a single testing period. As the number of leads on DUT 30 increases with increasing complexities in electronic devices, the switching matrix 25 must be made increasingly larger and complex, and thus becomes more and more expensive.

Wave formatters 26 serve to receive timing signals from the limited number of timing generators 24 and provide to pin electronics 27 the appropriate test waveform. Certain of these test waveforms are shown in FIG. 2a, although it is understood by those of ordinary skill in the art that other such test waveforms are possible. FIG. 2a shows a plurality of five periods of a timing generator, with a test data provided by vector memory 22 being a logical 0, 0, 1, 1, and logical 0, respectively, during these five timing periods. All transitions are reflected to one or more edges of the timing generators. The remaining portions of FIG. 2a show the result of combining the timing generator information and the test data information in order to provide a nonreturn to 0 - true data (NRZ) signal with the edges appearing at the beginning of each timing generator clock period, NRZ - false data with the edges appearing at the beginning of each timing generator clock period return to zero (RTZ) - true data, return to one (RTO) - false data, and RTZ - false data.

Test system 10 also includes vector memory 22. Vector memory 22 stores a plurality of test vectors which in essence each consist of a plurality of bits defining the binary signals to be applied to DUT 30, and the proper output signals which are to be received by a properly functioning device under test in response to the input signals defined by that test vector word. In practice, CPU 15 controls vector memory 22 in order to cause vector memory 22 to sequentially provide to tester data bus 23 a plurality of test vectors. These test vectors are received by wave formatters 26. Wave formatters 26, in response to the test vector supplied by vector memory 22 and the timing signals provided by the limited number of timing generators 24 as routed by switching matrix 25, provide analog signals to pin electronics 27 which in turn provide analog test signals to DUT 30.

Wave formatters 26 (FIG. 1) are controlled by CPU 15 via tester access bus 21 in order to select the appropriate test waveform for each lead of the device under test 30. Although only six such wave formatters are shown in FIG. 1, such prior art computerized test sytems contain a wave formatter for each lead of the device under test which is capable of being simultaneously tested. This is often on the order of 60 to 120 leads, and thus 60 to 120 wave formatters are provided. The output signals from wave formatters 26 are provided to an appropriate one of pin electronics 27. Here again, a plurality of pin electronics are provided, one such pin electronics circuit for each lead of the device under test which is capable of being simultaneously controlled by computer test system 10. Pin electronics 27 serves to combine the analog signals from wave formatters 26 and the voltages and currents provided by DUT supplies 13 to provide appropriate test signals to DUT 30.

In testing electronic devices, a number of factors are of importance. First of all, the ability to force selected voltages and currents with accuracy is essential. Secondly, the ability to measure current levels and voltage levels as a result of the testing operation, is important. Thirdly, accurate timing of the test signals applied to the device under test or measured from the device under test is essential. For example, in a typical memory device such as a RAM, a ROM, or a PROM, appropriate addressing signals are applied to the device under test, and the device under test provides an output word which is compared with a table of correct data which should be stored in the memory device. Naturally, all memory devices require a certain amount of access time, and thus the tester must wait for a certain period of time after applying address signals prior to reading the output word from the device under test to determine if the output word from the device under test is correct. As a first requirement, sufficient timing voltage and current resources must be available to exercise all the pins of the device under test for each test cycle. Unfortunately, as integrated circuit devices become more complex, the limited number of timing generators provided can become insufficient, requiring complex schemes to allow testing of all pins with the limited number of timing generators. Accordingly, test system 10 must be capable of very accurately providing timing information to a device under test and measuring the time when information is returned by the device under test.

Furthermore, manufacturers specify and customers demand that such electronic devices operate at certain speeds. In other words, for the example of memory device, it is expected that within a certain time after address signals are applied, the user can expect to receive appropriate data on the output leads of the memory device. Accordingly, it is essential when testing such a device that the output signals be received within a certain specific time after providing the address signals to the device under test. Accordingly, test system 10 must be capable of very accurately presenting timing information to a device under test and measuring the time when information is returned by the device under test. Therefore, it is essential that, once timing generators 24 provide their timing signals under the control of central processing unit 15 to vector memory 22, these timing signals arrive at the appropriate leads of DUT 30 as accurately as possible. Unfortunately, as in any system, there are propagation delays between timing generators 24 and DUT 30. Furthermore, these propagation delays differ, depending upon the exact path the timing signals must take from timing generators 24 to their appropriate leads of DUT 30. In other words, each wave formatter 26 has its own specific propagation delay. Secondly, each pin electronics 27 also has its own specific propagation delay. Thirdly, switching matrix 25 provides additional and unequal propagation delays to each timing signal being routed from timing generators 24 to wave formatters 26. In the case where a single timing signal is being routed to a plurality of wave formatters and thus leads of DUT 30, the timing signal will encounter different propagation delays on its route to the various leads of DUT 30. Each of the propagation delays provided by switching matrix 25, wave formatters 26, and pin electronics 27 are cumulative in nature, and thus each timing signal is delayed by a unique propagation delay when passing from timing generators 24 to DUT 30. Adjustments must be made in order to make each of these propagation delays as equal as possible in order to maintain the relative timing of the timing signals once they reach device under test 30. Accordingly, a number of so-called "deskewing" elements are provided in each path between timing generators 24 and DUT 30. Such deskewing elements 31 are shown by way of example in a selected path of switching matrix 25, a selected one of wave formatters 26, and a selected one of pin electronics 27, although it is understood that each path in switching matrix 25, each wave formatter 26, and each pin electronics 27 may have its own deskewing element 31 for maximum accuracy. Deskewing elements 31 serve to provide an additional and adjustable propagation delay such that the total propagation delay along each path from timing generators 24 to device under test 30 may be made to be equal. Manual or computer controlled deskewing elements may be used. Manual deskewing elements 31 typically comprise RC delay circuits and are generally manually adjusted. In other words, during manufacture of the computer test system 10 and during subsequent repair and preventive maintenance operations, a skilled technician is required to utilize expensive test equipment in order to measure the propagation delay between timing generators 24 and the leads of a device under test 30. These technicians must then take great care in order to manually adjust all or some of the deskewing elements 31 in order to cause the propagation delay between timing generators 24 and DUT 30 to be made as close as possible. Unfortunately, this is a rather time-consuming task which requires a skilled technician and expensive measurement equipment. Furthermore, it is often found that such adjustments must be made rather frequently in order to ensure that the propagation delays between timing generators 24 and device under test 30 remain within the required specification. In addition to being rather expensive, such readjustments necessarily cause computer test system 10 to be taken out of service, resulting in undesirable down time, and thus a loss of production capability of computerized test system 10. Also, as the complexity of the timing path grows, it becomes more difficult to make the propagation delays provided by all the paths equal. At the same time, customers are asking for increased accuracy to test faster, more complex devices. Newer deskewing elements use digital to analog converters which provide an analog value in response to a digital word which controls the switching threshold voltage level on a gate, thereby providing an adjustable gate propagation delay. This simplifies the technician's job, but the problem of having a complex signal path which requires deskewing, remains. Such deskewing elements are rather complex and costly, and not completely accurate.

In addition to the fact that the propagation delays between timing generators 24 and DUT 30 are different and must be adjusted, it has also been found that the propagation delays provided by wave formatters 26 vary depending upon whether the data provided by vector memory 22 which controls that wave formatter is a logical 1 or a logical 0. Because this type of skew in the propagation delay is dependent upon the test data, such data dependent skew has heretofore been either impossible, or incredibly difficult and only roughly approximate to deskew.

Accordingly, it is seen that the errors which occur in the timing signals provided to device under test 30 are caused by several sources;

1. The error in the centrally-generated timing signals provided by timing generators 24. These errors are due to the limits of the resolution of timing generators 24 and calibration error.
2. Error in the switching matrix 25, due to drift and cross talk.
3. Error in deskew elements 31, due to limitations of resolution, drift, and measurement errors made during adjustment of deskewing elements 31.
4. Error in wave formatters 26.

5. Variation in the rise time of signals at DUT 30 due to differences in the specified voltage swings at device under test 30.
6. Error in master clock 11 due to drift, cross talk, and calibration errors. Having these multiple sources of error in a prior art system is a problem in itself. Since timing information is subject to each of these errors sequentially as it proceeds from timing generators 26 to DUT 30, standard statistical analysis dictates that the overall error is the sum of the individual error terms. Even when all elements of the timing path are built with the best available technology, the overall error will be the sum of these individual errors, and greater error is present than if fewer sources of error were present.

Another major problem with adjusting deskewing elements 31 contained within switching matrix 25 is that, during operation of test system 10, switching matrix 25 is constantly being reorganized in order to cause the timing generators 24 to be connected to various wave formatters 26. Due to this switching of matrix 25, the propagation paths and thus the propagation delays through switching matrix 25 are constantly changing. This means that deskewing elements 31 contained within switching matrix 25 can only be approximately adjusted to remove an average amount of deskew which will be provided by switching matrix 25. However, in practice, a selected path through switching matrix 25 will generally have either a greater or less propagation delay than this "average" propagation delay through switching matrix 25, and thus deskewing elements 31 contained within switching matrix 25 are capable of only approximately deskewing switching matrix 25.

SUMMARY

In accordance with the teachings of this invention, a unique, automatic test system is provided in which timing signals are generated in a novel manner as compared with prior art test systems. In accordance with the teachings of this invention, all adjustments for propagation delays of timing signals are made in a digital fashion, by adjusting the digital information which defines when an analog timing signal is to be generated. In this manner, deskewing of propagation delays is performed automatically under computer control, rather than by requiring careful adjustment of hardware deskewing elements. Furthermore, by adjusting for propagation skews digitally, propagation skews dependent on data values (logical 0 and logical 1) can be made. Furthermore, in accordance with the teachings of this invention, timing signals are provided by three timing edges, rather than by a timing pulse, thereby allowing more accurate generation of timing signals. As another feature of this invention, the use of a complex switching matrix is eliminated by providing at least one timing generator per pin of the device under test, thereby eliminating complex hardware, propagation errors related to switching matrices, and providing enhanced capabilities for the user while simultaneously simplifying the problems associated with creating software used to control the test system during testing a device under test.

DETAILED DESCRIPTION

In accordance with the teachings of this invention, a unique test system is provided which does a number of things: (1) provides an independent timing generator assigned to each lead of the device under test, thereby preventing the problem of not providing a sufficient number of timing generators; (2) allows the switching matrix to be completely eliminated since no timing generators are shared between multiple pins of the device under test; (3) allows the number of error terms to be reduced since all of the timing compensation is performed with one timing value and one timing generator; and (4) allows timing to be provided by edges rather than a pulse, so that more than two edges can be made available to create waveforms.

Figure 3:
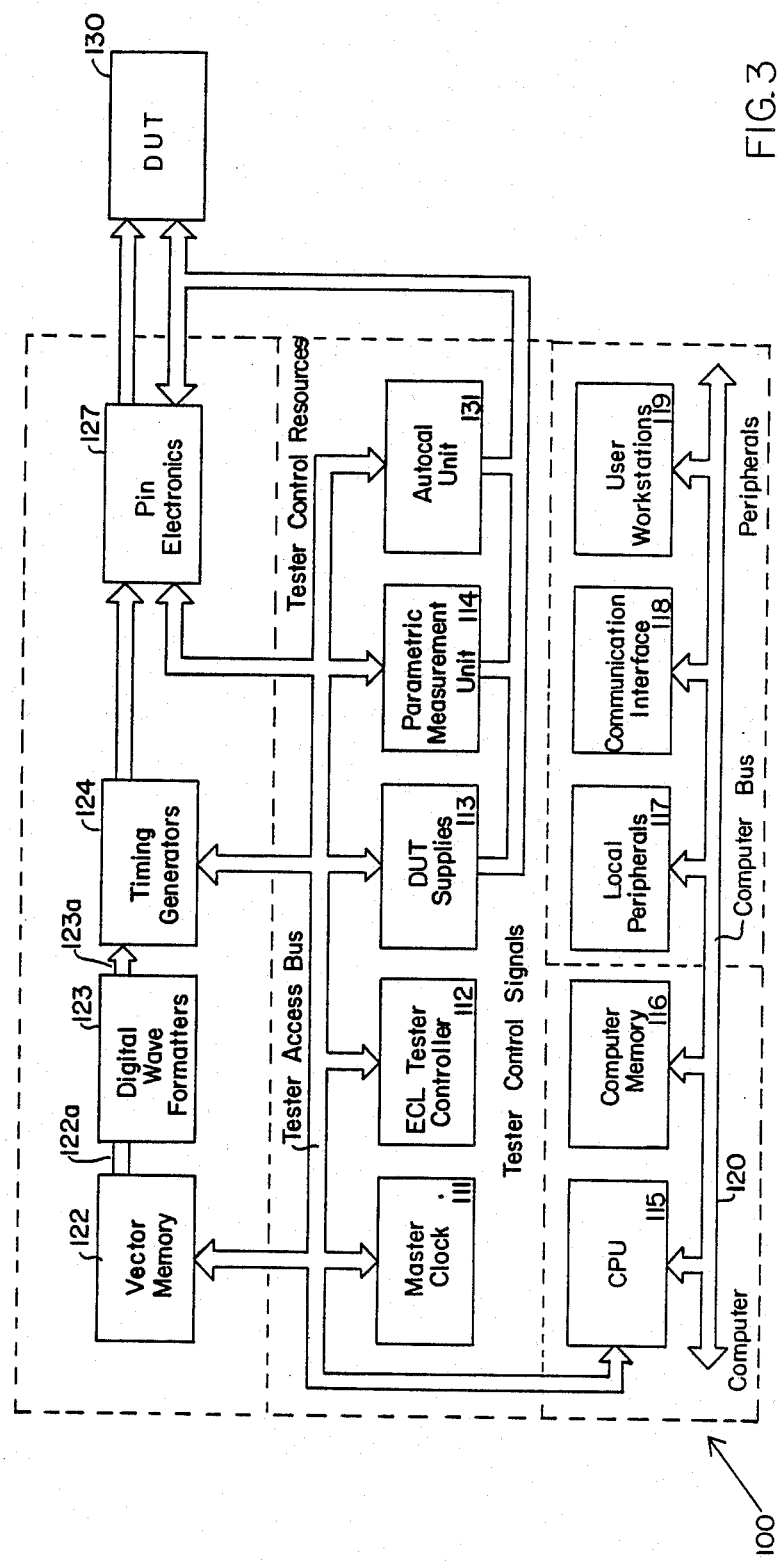
FIG. 3 is a block diagram of one embodiment of a structure constructed in accordance with the teachings of this invention.

One embodiment of a test system constructed in accordance with the teachings of this invention is shown in the block diagram of FIG. 3. Test system 100 includes many of the basic elements found in any automatic test system, such as master clock 11, DUT power supplies 113, PMU 114, CPU 115, computer memory 116, local peripherals 117, communication interface 118, and user work station 119. Accordingly, these elements are well known to those of ordinary skill in the art and will not be described in detail in this specification.

In addition, test system 100 includes ECL tester controller 112 which serves to augment tester CPU 115 in the control of the test hardware, and vector memory 122 which contains a plurality of test vectors. Test system 100 also includes wave formatters 123 which combines with test vector data to describe the selected waveform for each pin of the device under test in each test cycle. Of importance, test system 100 includes a plurality of timing generators 124 which typically number approximately 160, but can be any desired number. Most prior art test systems diligently strive to minimize the number of timing generators used in order to minimize expense. Such prior art test systems made great efforts to provide switching matrices for selectively connecting the output signals from a selected timing generator to one or more selected leads of a device under test. Such prior art systems also made great efforts and incurred great expense to deskew the errors between the propagation delays provided by such matrices. In contrast to the prior art, the present invention approaches the design of a test system from a different point of view. In contrast to prior art test systems, the test system constructed in accordance with the teachings of this invention includes a plurality of timing generators 124, each timing generator being uniquely associated with a specific pin electronic unit which in turn is associated with a unique lead of DUT 30. In other words, rather than designing each timing generator for possible use on a number of leads of DUT 30 through a complex switching matrix, this invention effectively restricts the use of each timing generator to a unique lead of DUT 30. This is contrary to the thinking of prior art test systems, because if the test system constructed in accordance with the teachings of this invention is to be able to test a device having a large number of leads, a greater number of timing generators is required than was required in the prior art. However, the teachings of this invention provide several distinct advantages. First, although a greater number of timing generators are used, the additional timing generators provide the programmer and user with greater flexibility in testing devices. Secondly, because each timing generator is uniquely associated with a specific pin electronics circuit, the need for a switching matrix has been eliminated, thus providing some savings in cost. More importantly, the elimination of the switching matrix eliminates propagation delays and skews among propagation delays caused by the use of a switching matrix. Thus, fewer deskewing elements are necessary, calibration is significantly eased, and accuracy is increased. Also, having a timing generator per pin allows wave formatting functions and timing functions to be sequentially reversed so that wave formatting becomes a digital selection from which timing signals are generated and utilized without further processing. Utilizing timing signals without further processing reduces the number of error sources and improves accuracy of the timing signals. Also, formatting waveforms before generating timing signals allows different timing information to be used for logic 1 versus logic 0 data, adding a new element of timing accuracy not previously possible. Also, eliminating the complex switching matrix allows timing edges to be handled independently rather than as a pulse, and allows more than two edges to be used, resulting in the ability to create more complex waveforms that users desire. This could only be done in a prior art test system by having a separate switching matrix for each timing edge desired; something which would be too difficult and costly to be practical.

Figure 1:
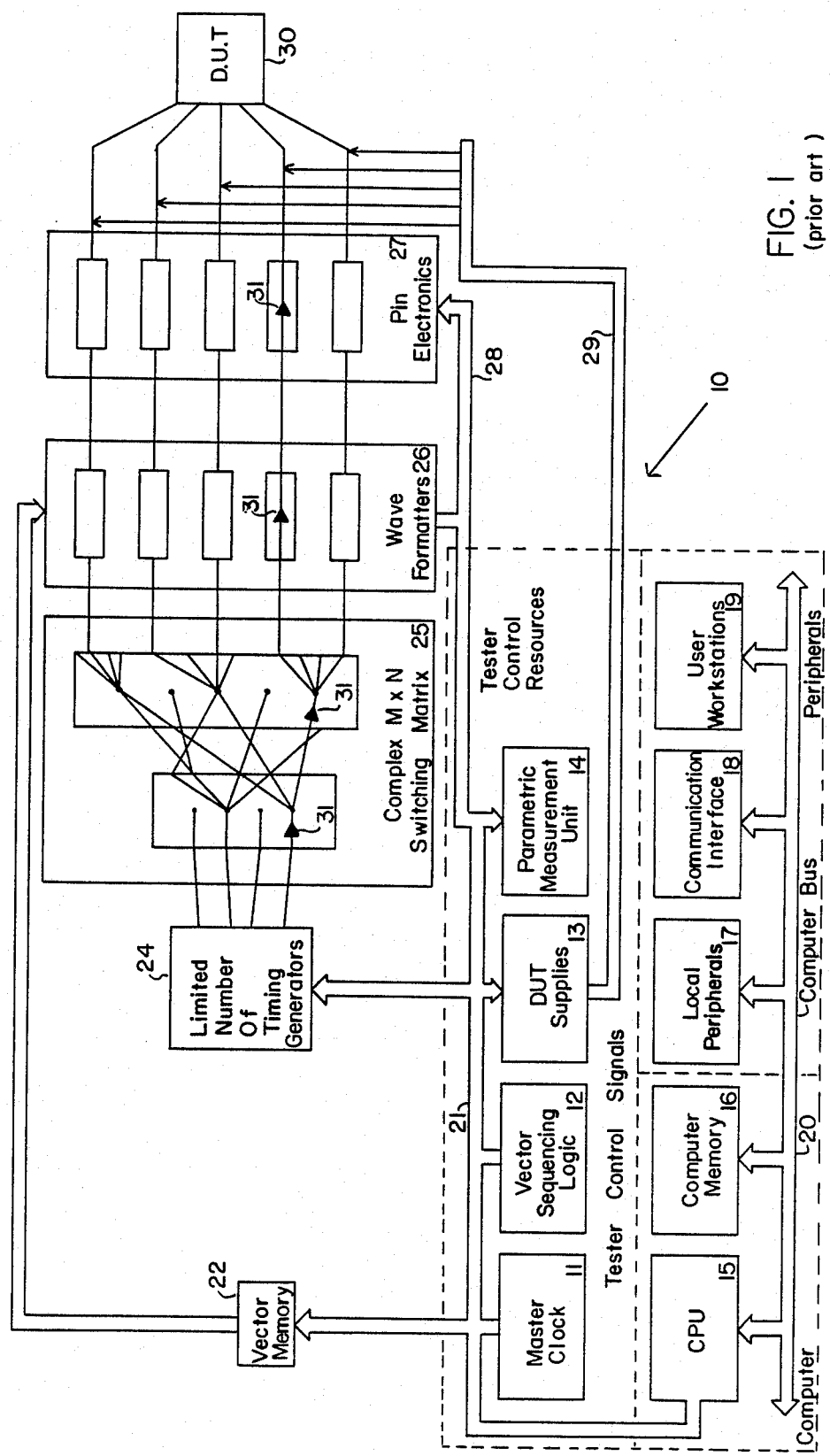
FIG. 1 is a block diagram of a prior art automatic test system.

Test System 100 also includes digital wave formatters 123 which differ from prior analog wave formatters 26 of prior art test system 10 (FIG. 1). In response to test vectors supplied by vector memory 122 via vector bus 122a, digital wave formatters 123 provide a digital output word on bus 123a to timing generators 124. The digital word provided by digital wave formatters 123 is derived in response to the vector provided by vector memory 122. Each vector stored in vector memory 122 contains two parts, as shown in FIG. 4. In one embodiment of this invention, each vector stored within vector memory 122 is a 32+N bit word, where N is the number of pins of DUT 30. The first 10 bits of the 32 bit portion of the test vector form the global cycle type (GCT). The global cycle type is common to each timing generator 124 (FIG. 3) associated with each lead of DUT 130. The global cycle type specifies one set out of a possible 128 sets of waveforms for each lead of DUT 130 which is to be tested by this test vector. Although a large number of potential waveforms can be generated by Test System 100, it is almost certain that a relatively small number of these waveforms will be used during any given sequence of test steps during the testing of DUT 130. Therefore, the user can, prior to executing the test sequence to test DUT 130, specify this plurality of waveform sets. The GCT serves to define which set of waveforms is to be used with this particular test vector. In other words, rather than trying to define which ones of a large number of possible test waveforms is to be applied to each lead of DUT 130, the 10-bit GCT serves to define which set of these waveforms is to be used during this test step. In this manner, the relatively small 10-bit GCT serves to address global to local cycle table 150, which serves as a look-up table which further defines which of the large number of possible waveforms for each pin is to be applied to each lead of DUT 130 of this waveform set. The GCT also defines the period of the waveforms to be generated by the test vector. Naturally, the GCT can be formed to contain other than 10-bits, or simply not used at all, if desired.

Also, as shown in FIG. 4, each 32-bit field of a test vector includes 6 bits which define a mask (M) word, 6 bits which define a drive (D) word, and 6 bits which define an invert (I) word which collectively serve as an alternative way to control which waveform of waveform table 150 is selected for each pin of DUT 130 for each test cycle. This alternative selection capability is provided to provide compatability with certain prior art test systems.

The remaining N bits of information in test vector 122a comprise single data, a single bit associated with each lead of DUT 130, where N is the total number of leads of DUT 130. This data defines the logical values, i.e., logical 0 or logical 1, which are to be applied to each waveform selected by each global-to-local cycle table 150 for this cycle.

The GCT, M, and D words are applied as an address to global-to-local cycle table 150. The global-to-local cycle table 150 value selected plus the vector data value and I word value in turn serves to select an entry in waveform tables 151 associated with each DUT lead. It is an important feature of this invention that all waveform information and data information are treated as digital information to select an entry in the waveform table and that waveform information is not applied to timing pulse information as in prior art systems. It is also important that the vector data value can cause one of several different waveform table values to be selected, depending on this data value, thereby allowing the timing to be adjusted independently for each data value, a capability not achievable in prior art systems.

Because many desired waveforms can be defined by at least three edges, test system 100 constructed in accordance with the teachings of this invention includes three separate edge generators 124-1 through 124-3 per lead of DUT 130. Of course, as will be appreciated by those of ordinary skill in the art, the teachings of this invention can be utilized with greater than three edge generators per pin, or fewer. In fact, the use of a single edge generator associated with the device under test, said edge generator capable of providing more than one edge per test cycle, is contemplated. Referring again to FIG. 4b associated with each edge generator 124-1 through 124-3 are 64 separate sets of waveform information stored in waveform table 151. The selected entry from waveform table 151 provides information to configure the timing generators for each test cycle. In one embodiment of this invention, the waveform table entry consists of 72 bits which provide 24 bits to configure each of three independent timing edge generators 124-1 through 124-3. The 24 bits are used to select which of seven waveform circuit types will be used, which of 1,024 master clock cycles will be used to trigger the timing edge generator, and in which 100- picosecond step the edge generator will fire over a range of 100 picoseconds to 59.9 nanoseconds after the trigger cycle.

An important feature of this invention is that in one embodiment, three separate and independent edge generators are provided for each pin. Because of this, each edge can be treated with independent circuitry and not the same circuitry as in prior art systems where timing is treated as a single two-edged pulse. This allows timing to be placed with 100-picosecond resolution over the full 1,024 master clock count range with no gaps or dead zones. When timing is treated as a pulse of information and formatting information is applied to the timing pulse after it is created, it is very difficult to avoid dead zones in the timing and in fact most prior art test systems exhibit dead zones. Stated differently, the propagation delay for a logical 0 to a logical 1 transition of an analog signal differs from the propagation delay of a logical 1 to logical 0 transition of the analog signal, even when the analog signal is travelling along the exact same path through test system 100. Prior art test systems did not allow for deskewing this difference in propagation delays along a signal path due to the state of the data being transmitted along that path. In accordance with the teachings of this invention, however, two separate words are selected from waveform table 151 and used for each edge generator, one associated with logical 0 data, and the other associated with logical 1 data. Thus, the propagation delay along each path can be accounted for separately for logical 0 and logical 1 information providing a significant improvement in accuracy as compared with prior art test systems.

Figure 2A:
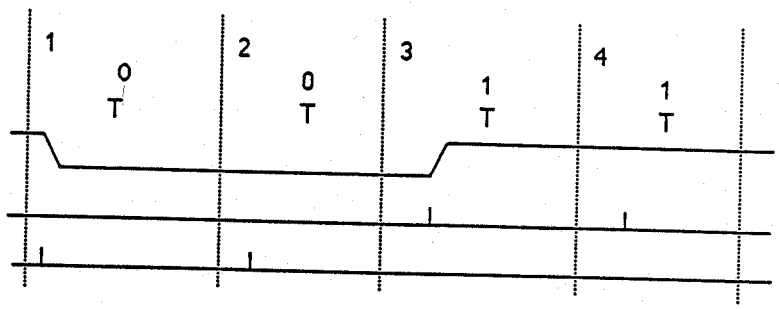
FIGS. 2a and 2b are graphs depicting certain timing signals capable of being provided by the structure constructed in accordance with the teachings of this invention.
Figure 2A:
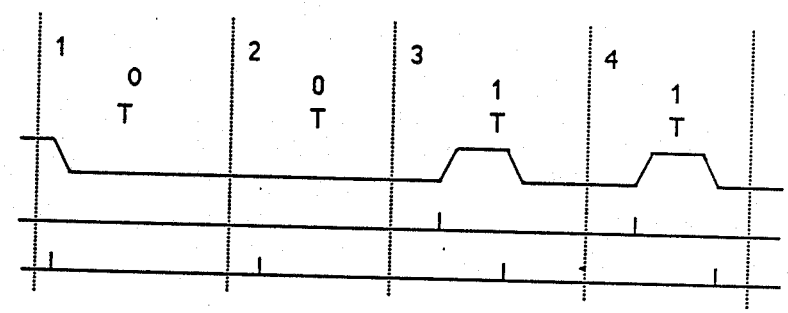
Figure 2A:
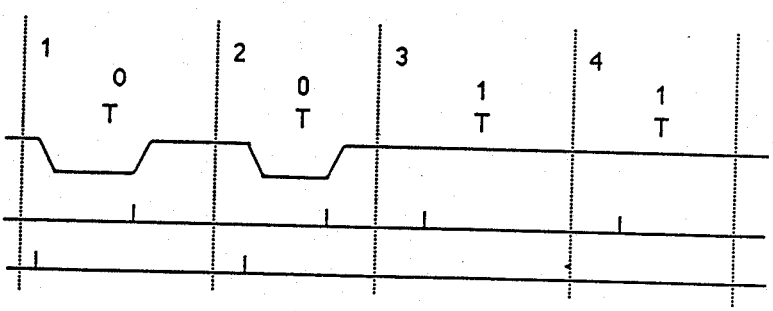
Figure 2B:
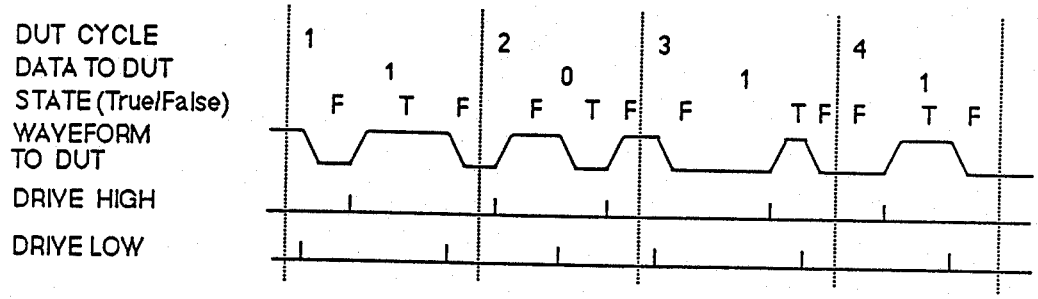
Figure 2B:
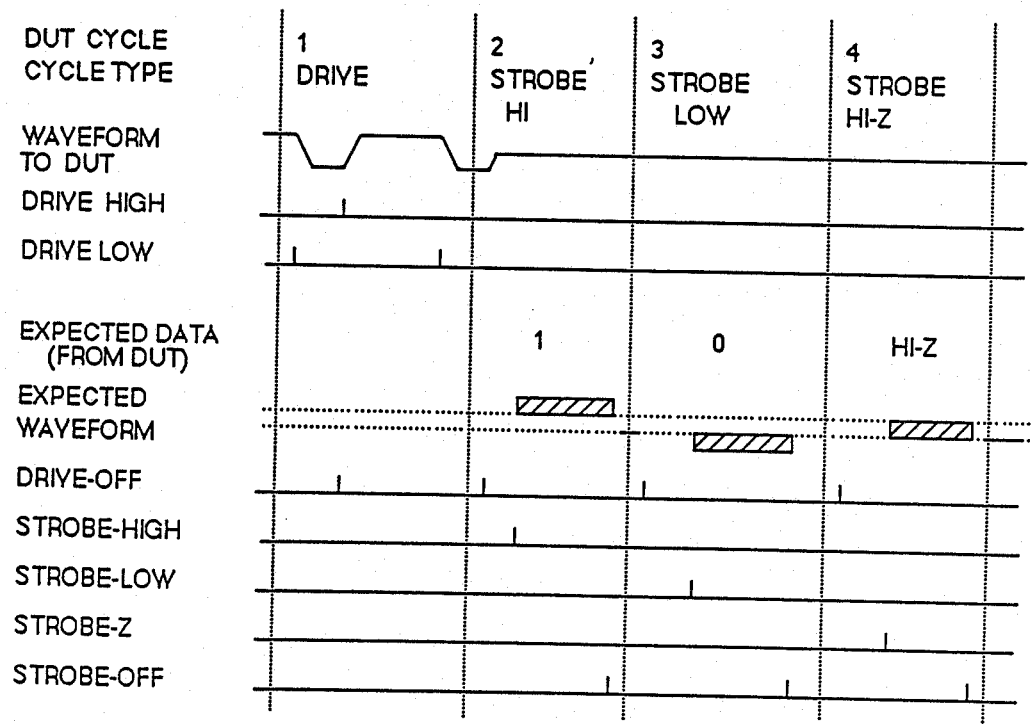

Another important feature of this invention is that three independent timing edges are provided per pin, providing more timing information than a prior art test system does with a 2-edge pulse. All this is also accomplished without any switching matrix, and as a direct result of having one timing generator dedicated to each pin. In one embodiment specifically, the seven circuit types selected are drive high, drive low, drive off, strobe low, strobe (high impedance), strobe high, strobe off. This invention allows the complex waveforms (shown in FIG. 2b) of surround by complement true data (drive low, drive high, drive low), surround by complement false data (drive high, drive low, drive high), generalized I/O switch and strobe true (drive off, strobe high, strobe off), and generalized I/O switch and strobe false (drive off, strobe low, strobe off) to be created, which are not possible in prior art test systems without multiple switching matrices.

Figure 4B:
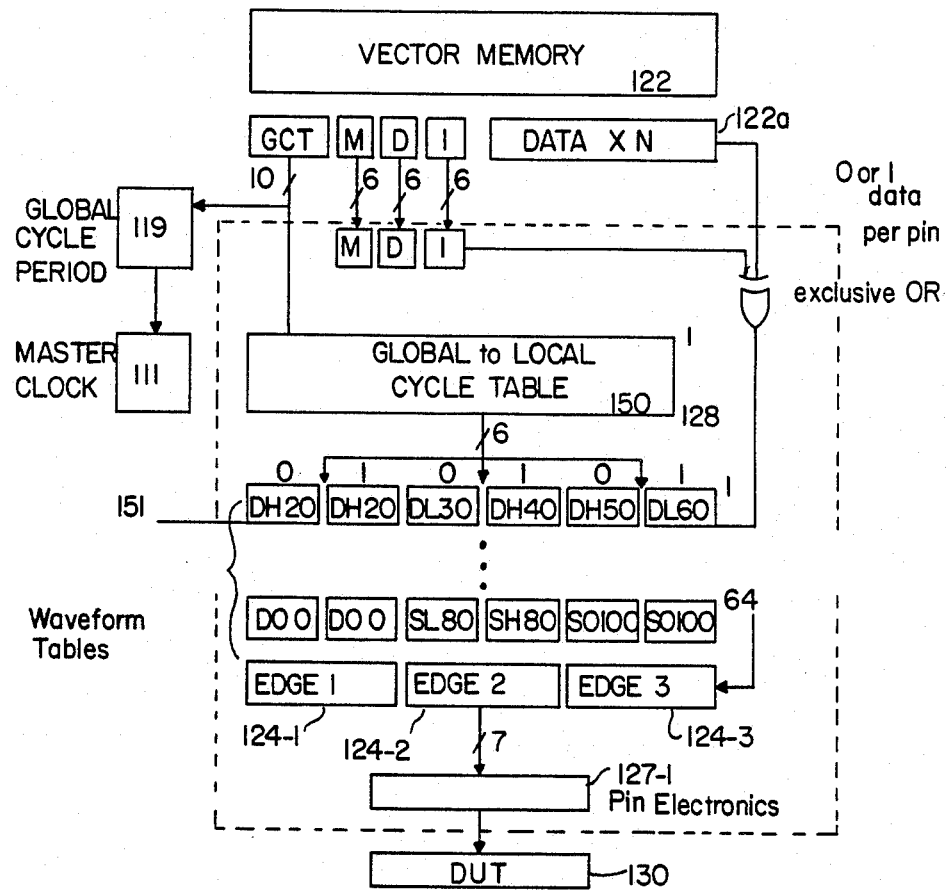
FIG. 4b is a block diagram of vector memory 122, digital waveformatters 123, timing generators 124, pin electronics 127, and device under test 130 of FIG. 3.
Figure 4A:
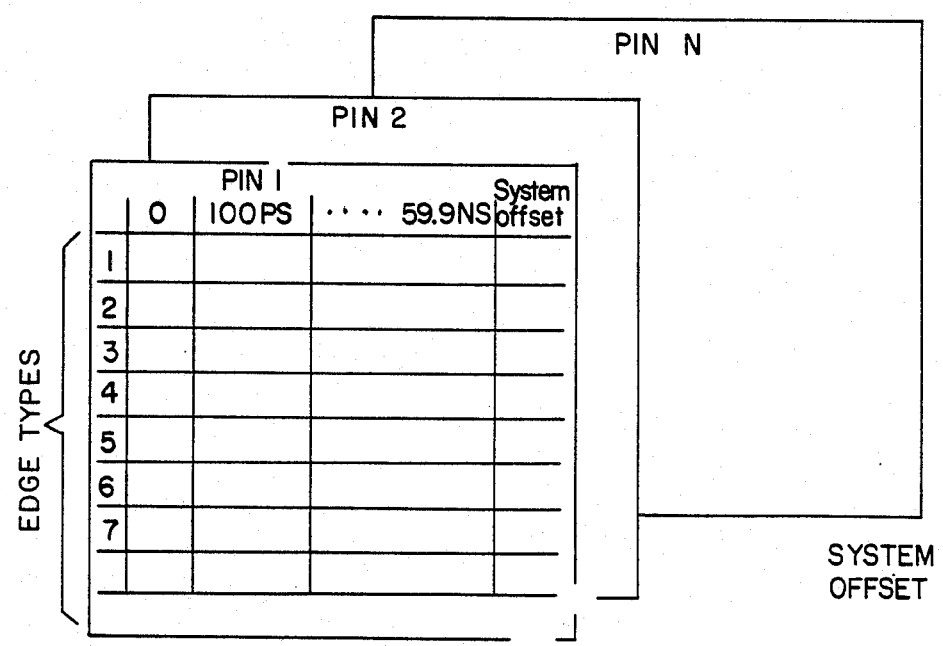
FIG. 4a is a chart depicting a calibration table of the system of FIG. 3.

Referring to FIGS. 3, 4a, and 4b, the operation of one embodiment of a test system constructed in accordance with the teachings of this invention will now be described. First of all, at periodic intervals (such as, for example, once per month) the computerized test system 100 is calibrated automatically by the use of automatic calibration unit ("autocal unit") 131. When test system 100 is placed in the autocal mode, CPU 115 controls autocal unit 131 which in turn sequentially generates timing edges for each pin electronics unit 127, for each of the seven edge types, and for each time delay stored in the calibration table shown in FIG. 4a. Thus, in the embodiment shown in FIG. 4a, the calibration table includes identical subtables for each pin in pin electronics unit 127. Each subtable of the calibration table forms a matrix which stores digital information defining when an edge should be generated by computer test system 100 in order to provide on the associated pin electronics unit an edge corresponding to the desired time within a timing period. As shown in FIG. 4a, in this embodiment of our invention, each subtable of the calibration table provides a matrix defined by each of seven edge types, and a specific time period within the range of 0 to 59.9 nanoseconds, in 100 picosecond increments. While only times within the range of 0 to 59.9 nanoseconds are stored in the calibration table of this embodiment, a wide variety of times can be generated, because the information stored in waveform table 151 includes a portion which defines how many master clock counts of the highly accurate master clock must be performed prior to using the time delay specified by the data received from the calibration table. For example, if a 100 nanosecond delay is desired, 8 master clock counts of a highly accurate 12 nanosecond clock is performed (i.e., 96 nanoseconds) prior to performing a 4 nanosecond delay as specified in waveform table 151, thereby providing a 100 nanosecond delay prior to generating this edge. A calibration table range of greater than 12 nanoseconds is utilized in order to allow timing edges to be freely moved across test cycle boundaries without incurring any timing dead zones. Of importance, because the master clock counts are performed on a highly accurate clock (i.e., accurate to within 0.5 ppm), no adjustments are made for timing errors due to minor counts, since any such minor count timing errors are negligible (i.e., less than 20 picoseconds). Thus, in accordance with the teachings of this invention, periodically computer test system 100 is automatically calibrated to store in the calibration table digital information defining when each edge generators associated with each pin of DUT 130 is to be fired in order to provide a physical timing edge on the pin electronics unit at a specified time increment from the start of the timing period. In other words, the digital data stored in the calibration table and which is associated with a particular edge type and a particular delay time alters the actual timing of each edge in order to remove timing errors caused by any source. Each subtable of the calibration table also includes, for each edge type, a system offset. The system offset defines actual analog skew located between pin electronics 127 and the associated lead of DUT 130. This analog skew is caused by differences in the propagation delays between pin electronics 127 and the associated leads of DUT 130, and includes skews and propagation delays along the paths of the load board containing the test socket which holds DUT 130 during electrical testing. Since these system offsets are dependent on user defined hardware, such as loadboards and the circuits constructed therein, the system offsets are recalculated when loadboards are changed. This system offset calibration is quite easily performed, and takes little time and yet provides valuable calibrating information to insure that highly accurate timing edges are delivered to each lead of DUT 130. This calibration of analog delays is performed by any suitable technique, as are well known in the prior art and thus will not be described in detail here. Therefore, the appropriate system offset value associated with a particular lead of DUT 130 and a particular waveform type stored in the calibration table is added to the desired time delay for generating a waveform edge prior to looking up the digital information associated with the particular lead of DUT 130 and the waveform type to be used, thereby compensating for the analog skew in the system. Of importance, in accordance with the teachings of this invention, all timing and analog skew in the system is compensated for by modifying the programmed digital value of the timing generator edge. This reduces to a minimum the number of sources of timing error and allows test systems constructed in accordance with the teachings of this invention to be inherently more accurate than the prior at system which must sum timing error terms produced in several places and compensate for these errors by adjusting an analog timing pulse, rather than by adjusting digital timing information, as is done in this invention.

As vector memory 122 cycles through test vectors which define a test sequence to be applied to DUT 130, a single test vector is utilized at any given time. As previously described, the first 10 bits of a test vector define the global cycle type which defines the timing period and which address global-to-local cycle table 150 (FIG. 4b) which in turn defines which waveform type is to be selection from waveform table 150 associated with each pin electronics unit 127 and thus in turn is associated with each lead of DUT 130. Thus, the GCT addresses a word in global-to-local cycle table 150 which in turn accesses a word stored in waveform table 150 which defines where in time and what type edges are to be generated for a single cycle from the plurality of waveforms stored in waveform table 150. Then, for each lead of DUT 130, the waveform defined for that lead by waveform table 150 causes certain digital information to set the type and timing of the selected waveform in the timing generator where the timing includes any calibration adjustment as determined by the calibration process. Of importance, each waveform table associated with a particular pin electronics unit (and thus a particular lead of DUT 130) is constructed of three portions, one to store data used to control each of the three edge generators 124-1 through 124-3 associated with each pin electronics unit 127-1. Each portion associated with a particular edge generator is in turn subdivided into two portions, one for logical 0 data, and one for logical 1 data. In turn, each of these portions of waveform table 151 stores a plurality of 64 individual words, thus allowing 64 possible waveforms to be selected for each vector cycle. The test vector from vector memory 122 also includes the M, D, and I words, as previously described. The test vector from vector memory 122 also includes data bits, one data bit associated with each lead of DUT 130, thereby defining the logical state (i.e., logical 0 or logical 1) of each lead of DUT 130. This data information serves to select the appropriate portion of waveform table 151 for each edge generator 124-1 through 124-3, thereby allowing appropriate digital information to be selected from waveform table 151 for use by each edge generator 124-1 through 124-3, thereby allowing edge generators 124-1 through 124-3 to produce edges as precisely as possible, considering the fact that the precise positioning of these edges provided by edge generators 124-1 through 124-3 depends in part upon the data (i.e., logical 0 or logical 1) provided on each lead of DUT 130. This ability to provide separate information for generating the edges depending upon the data level on each lead is in stark contrast to prior art test systems in which each edge was generated without considering the specific state of the data associated with that lead.

Figure 5:
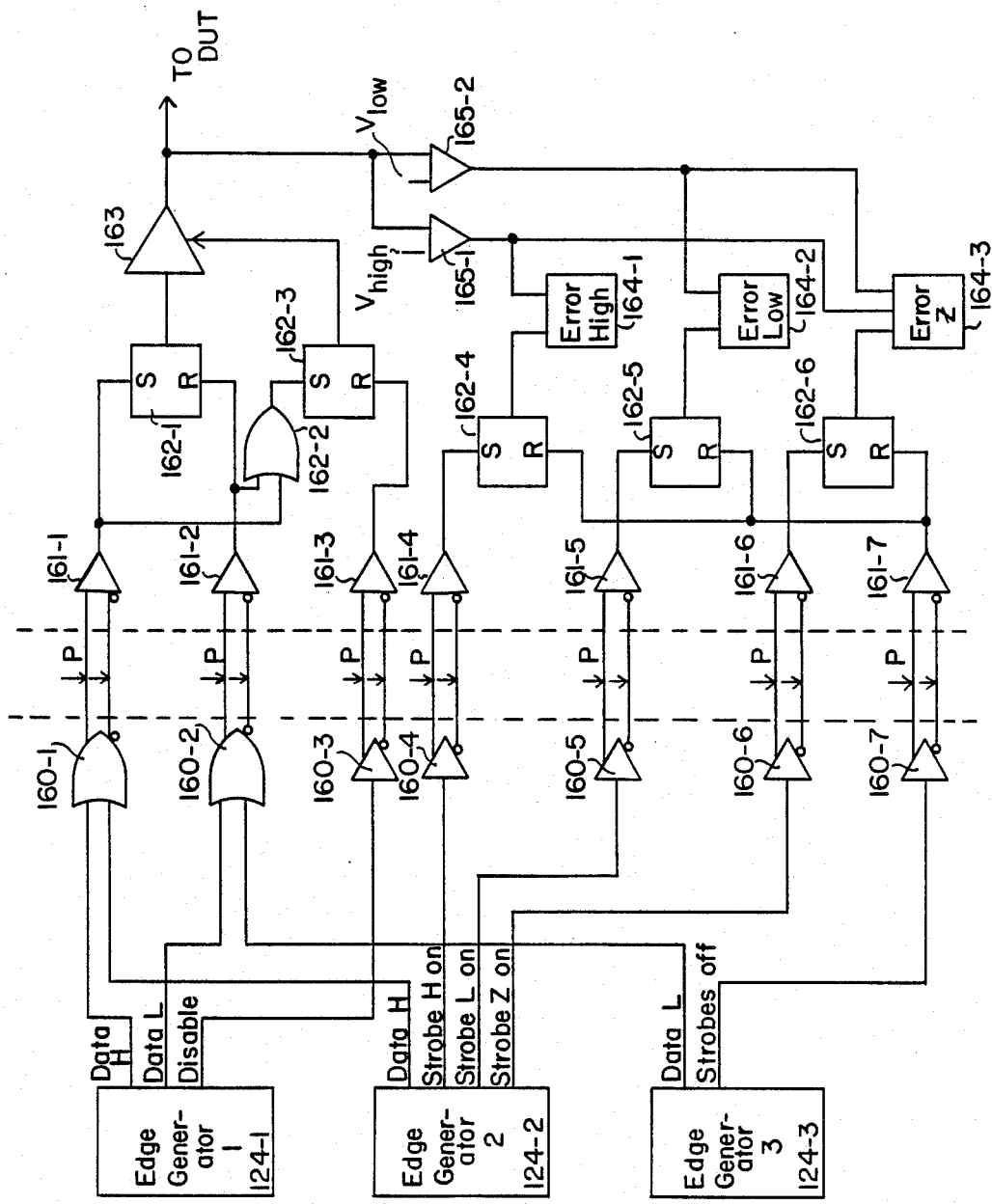
FIG. 5 is a schematic diagram of one embodiment of pin electronics 127 of FIG. 3.

Referring now to FIG. 5, it is seen that each edge generator 124-1 through 124-3 provides a plurality of output signals which control a plurality of pin electronics circuit functions which collectively provide sufficient waveform controls to create many highly-desirable waveforms.

Edge generator 1 provides a drive data high signal which serves to set the pin electronics drive function to its logic 1 voltage level, a drive low logic signal which serves to set pin electronics drive function to its logic low level, a disable signal which serves to turn the pin electronics drive function off, generator 124-2 provides as output signals drive high, which serves to set pin electronics drive function to its logic high level, strobe high which serves to enable pin electronics voltage compare function to test for a DUT generated logic high voltage, strobe low which serves to enable pin electronics voltage compare function to test for a DUT generated logic low voltage, and strobe Z which serves to enable pin electronics voltage compare function to test a DUT generated high impedance state. Similarly, edge generator 13 provides output signals drive low which serve to set pin electronics drive function to its logic low level, and strobes off which serves to turn the pin electronic strobe function off.

We claim:
1. An automatic test system for electrically testing a device under test having a plurality of leads comprising:
a central processing unit;
vector memory for storing a plurality of test vectors;
a plurality of pin electronics units, each uniquely associated with one of said leads of said device under test, for providing electrical test signals to its associated lead;
a plurality of timing generators, each uniquely associated with one of said pin electronics units, said timing generators providing timing signals for control of said pin electronics units in response to digital waveform data provided to said timing generators, said timing signals comprising time domain signals for causing state transitions of said electrical test signals provided by said pin electronics units upon receipt of said timing signals, each of said timing generators comprising a plurality of edge generators under control of said digital waveform data, said edge generators providing timing signals to said pin electronics units; and
a plurality of wave formatters, each uniquely associated with one of said timing generators for providing said digital waveform data to its associated one of said timing generators, said digital waveform data determined by digital information from said vector memory which defines the data value, wave format, and time-domain position of state transitions of said electrical test signals generated by said associated one of pin electronics units, wherein said vector memory is capable of causing digital waveform data to be generated to independently configure each of said timing generators for each test cycle.

2. An automatic test system as in claim 1 wherein one or more of said test signals are generated by three or more timing edges defined by the digital waveform data.

3. An automatic test system as in claim 1 which further comprises a calibration table for storing information defining when, relative to the start of a test period, waveform edges are to be generated by said timing generators in order to insure that said waveform edges are applied to said pin electronics units at desired times after said start of said test period, wherein a particular combination of said waveform edges define a particular test signal waveform for application to said device under test.

4. An automatic test system as in claim 3 wherein said calibration table contains calibration information stored in a plurality of subtables, each subtable being uniquely associated with one of said timing generators, said calibration information used to modify a plurality of waveform edge types and a plurality of time delays after the start of a test period when a waveform edge is to be generated, thereby enhancing the accuracy of said automatic test system.

5. An automatic test system as in claim 4 wherein said plurality of waveform edge types comprise one or more waveform edge types selected from the group of waveform edge types consisting of drive high, drive low, drive off, strobe high, strobe low, strobe high impedance, and strobe off.

6. An automatic test system as in claim 3 wherein said calibration table comprises skew information defining when, relative to the start of a test period, said waveform edges should be generated by said timing generators in order to insure that said waveform edges are applied to said leads of said device under test at the desired time after said start of said test period.

7. An automatic test as in claim 6 wherein said skew information defines the analog delay provided between each of said timing generators and its associated lead of said device under test.

8. An automatic test system as in claim 1 wherein each of said timing generators is capable of providing three waveform edges during a single test period.

9. An automatic test system as in claim 1 wherein each said wave formatter is capable of providing data to its associated timing generator, said data being dependent on the binary state desired on said lead of said device under test associated with said associated timing generator.

10. In an automatic test system for electrically testing a device under test having at least one lead, having a central processing unit, vector memory for storing a plurality of test vectors, a pin electronics unit associated with said lead of said device under test for providing electrical test signals to said lead, and a timing generator associated with said pin electronics unit for providing timing signals for control of said pin electronics unit in response to digital data provided by said vector memory, the method of testing said device under test comprising the steps of:

providing a digital test vector from said vector memory defining a waveform to be applied to said lead of said device under test, including the logical state of said waveform, and the position of the edges of said waveform relative to the start of a test period;

providing to said timing generator a digital word defining when said timing generator is to produce said edges of said waveform, said digital word being provided as a function of the desired position of said edges of said waveform and the error caused by all sources; and delay provided between said timing generator and said lead of said device under test, said timing generator comprising a plurality of edge generators under control of the digital data.

11. The method as in claim 10 wherein said step of providing a digital word further comprises the step of adjusting said digital word to compensate for the analog delay provided between said timing generator and said lead of said device under test.

12. The method as in claim 11 wherein said step of providing a digital word comprises the step of adjusting said digital word to compensate for timing errors which are dependent on the logical state of the waveform to be applied to said lead of said device under test.

13. An automatic test system as in claim 1 wherein one or more of said waveforms are comprised of a plurality of timing edges per vector data bit as described by said wave formatters and generated by said timing generators.

* * * * *